United States Patent [19]

Yamada

[11] Patent Number: 5,049,963
[45] Date of Patent: Sep. 17, 1991

[54] HOLOGRAPHIC TELEVISION APPARATUS WITH SEMICONDUCTOR DEVICE

[75] Inventor: Takahiro Yamada, Hirakata, Japan

[73] Assignee: Matsushita Electric Industrial Co., Ltd., Osaka, Japan

[21] Appl. No.: 496,024

[22] Filed: Mar. 20, 1990

[30] Foreign Application Priority Data

Mar. 24, 1989 [JP] Japan .................................. 1-072440

[51] Int. Cl.$^5$ .......................................... H01L 27/14
[52] U.S. Cl. ........................................ 357/30; 357/17;
357/19; 357/55; 357/31; 357/37; 357/38;
359/6; 359/7; 359/22; 359/32; 359/33
[58] Field of Search ................. 357/30 P, 30 D, 30 R,
357/31, 55, 19, 37, 17, 38, 36, 38 LA, 27;
350/3.85, 3.63, 3.64, 3.84, 3.86, 3.75

[56] References Cited

U.S. PATENT DOCUMENTS

| | | | |
|---|---|---|---|
| 4,304,458 | 12/1981 | Huignard et al. | 350/3.63 |
| 4,462,040 | 7/1984 | Ho et al. | 357/55 X |
| 4,654,685 | 3/1987 | Yamada | 357/30 |
| 4,738,498 | 4/1988 | Baba | 350/3.63 X |
| 4,920,389 | 4/1990 | Itoh | 357/55 X |
| 4,941,030 | 7/1990 | Majumdar | 357/55 X |

*Primary Examiner*—William Mintel
*Attorney, Agent, or Firm*—Stevens, Davis, Miller & Mosher

[57] ABSTRACT

A holographic television apparatus is disclosed for detecting and displaying three-dimensional holographic information corresponding to a holographic optical interference pattern. The apparatus includes an image detecting device for successively detecting two-dimensional slices of the three-dimensional holographic optical interference pattern, an image reproduction device for successively reproducing two-dimensional slices of the three-dimensional holographic optical interference pattern, a transmission means connecting the image detection device to the image reproduction device, and an actuation unit for moving the image detection device at predetermined regular intervals in an depth direction normal to the two-dimensional image portions to obtain information with respect to the three-dimensional optical interference pattern at unformly spaced two-dimensional layers thereof corresponding to the displacement intervals. The reproduction device includes a display device which displays the three-dimensional portions of the three dimensional interference pattern. The actuation unit moves the display device at predetermined regular intervals in a depth direction normal to a display plane thereof to display information with respect to the three-dimensional optical interference pattern at uniformly spaced two-dimensional layers thereof corresponding to the displacement intervals of the display device. The displacements of the image detector and display device occur at a speed faster than the response speed of the human eye to achieve display of a convincingly three-dimensional image.

8 Claims, 12 Drawing Sheets

F I G. 6D
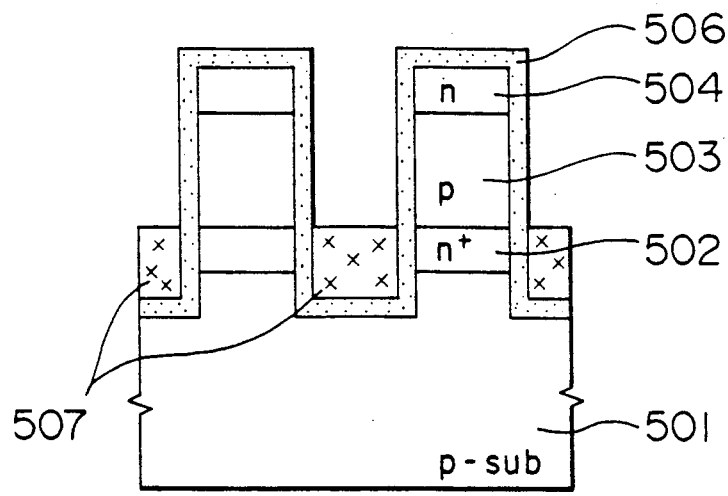
F I G. 6E
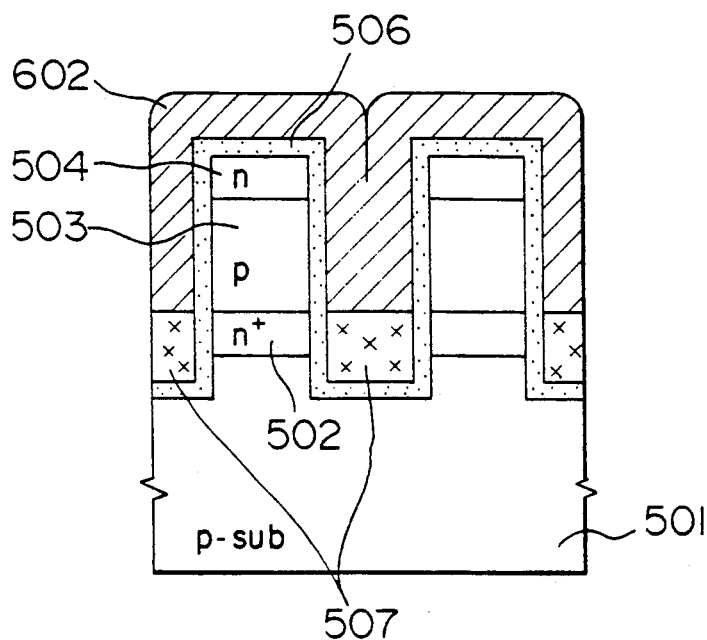
F I G. 6F
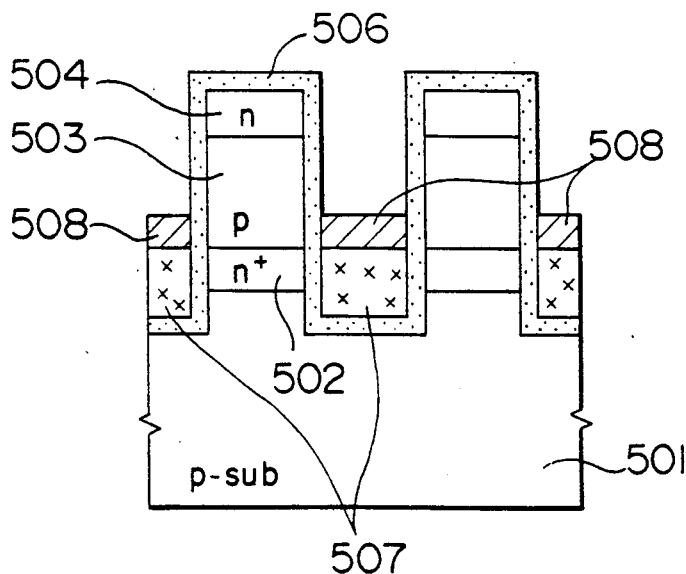

F I G. 8D
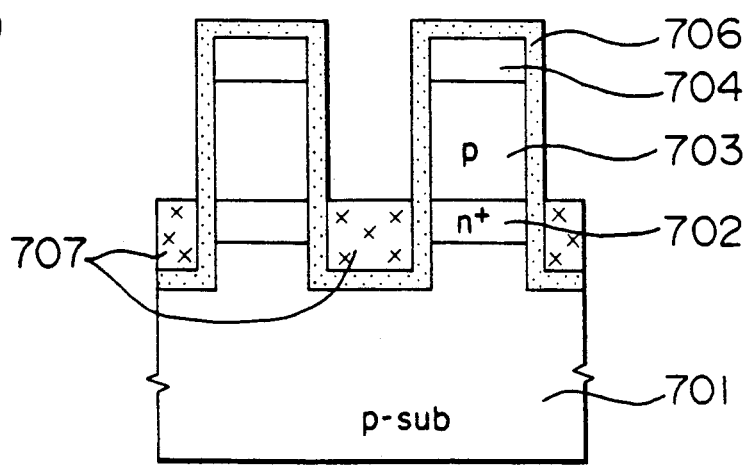
F I G. 8E
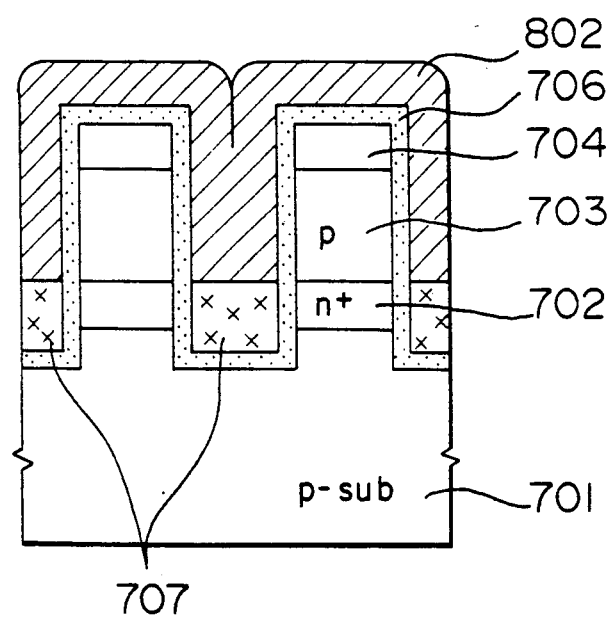
F I G. 8F
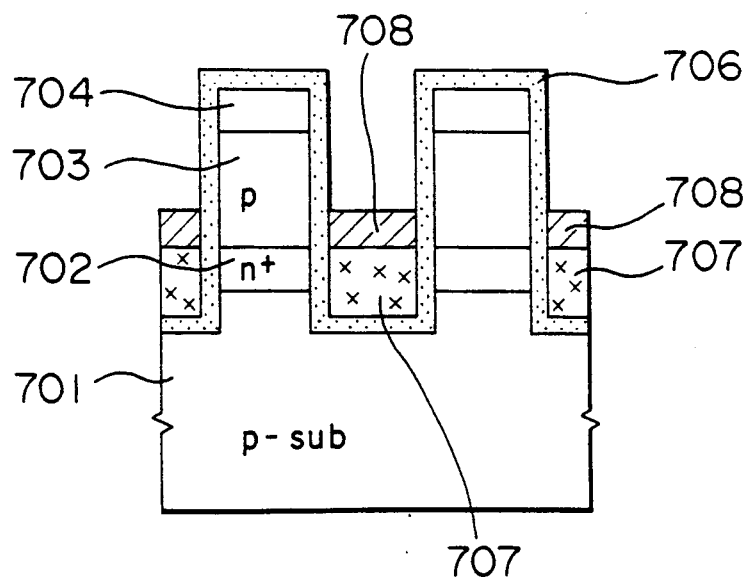

HOLOGRAPHIC TELEVISION APPARATUS WITH SEMICONDUCTOR DEVICE

FIELD OF THE INVENTION

The present invention is directed to a holographic television system.

BACKGROUND OF THE INVENTION

Recently, three-dimensional image display methods have been undergoing extensive study together with computer graphics. Since holography is a kind of photographic method, utilization thereof is very limited, although holography has excellent potential as a three-dimensional display method.

FIG. 9 schematically illustrates a principle of holography in the prior art. In FIG. 9, numeral 901 denotes a laser, 902 and 903 mirrors, 904 a beam splitter, 905, 906 and 907 lenses and 908 a photographic film. Operation of the holography apparatus configured above is now described.

A laser beam emitted from the laser 901 is divided into two directions by the beam splitter 904. The divided laser beams are spread through the lenses 905, 906 and 907 and are then overlapped with each other spatially. Interference fringes are formed in the direction of oblique lines in the space in which the laser beams are overlapped with each other (hatched portion in FIG. 9). A high-resolution photographic film 908 is set in this space so that both of the laser beams impinge on a recording surface of the film and the recording surface is exposed to the laser beams to record a pattern of the interference fringes on the recording surface. (An interval between the interference fringes is about 2 to 3 μm and the photographic film on which the pattern has been recorded and developed is denominated the hologram. Further, the pattern is hereinafter referred to as hologram information.)

As shown in FIG. 10A, when the hologram 1001 is illuminated with one of the laser beams of FIG. 9, for example, parallel light (parallel reference light) passing through the lens 906, part of the laser beam is diffracted by the hologram and transmitted in the same direction as that of object light passing through the lens 907. Consequently, a virtual image A' is produced at a position of a point object A and the hologram is reproduced. Then, as shown in FIG. 10B, when the hologram is illuminated from the quite opposite direction to that of FIG. 10A by the laser beam with the same wave front (parallel beam in this case), the diffracted light is also transmitted in the opposite direction to that of FIG. 10A and is converged into a point A" (real image).

However, the above configuration has problems as follows:

(1) The resolution (about 0.1 line/μm in the resolving power) of the sensor which can be utilized as an electrical detection device for the hologram information is very low as compared with the resolution (about 1 to 2 lines/μm in resolving power) of the photographic material used as the hologram and accordingly it is difficult to detect the hologram information.

(2) An actual holographic television apparatus which can be operated in real time by using holography has not been achieved because of the drawback that there is no actual display device which can display the hologram information electrically.

In such circumstances, the present inventor has proposed a system utilizing three-dimensional hologram information, although once an available imaging element and image displaying element (refer to U.S. Pat. No. 4,654,685) require a three-dimensional structure and the technique of fabricating a three-dimensional integrated circuit is undeveloped at the present time, there is no present prospect for realization.

SUMMARY OF THE INVENTION

It is an object of the present invention to provide a holography television apparatus which can electrically detect and reproduce hologram information by combination of a standard imager (image sensor), displayer (displayer device) and displacer (actuator for the image sensor or display device).

The holography television apparatus according to the present invention comprises a detection device for three-dimensional information including an imager provided with a displacer which displaces the imager stepwise by successive predetermined intervals, a reproduction device for the three-dimensional hologram information including a displayer provided with a displacer, and a transmission means for applying a signal derived from the detection device to the reproduction device, whereby the displacer gives a predetermined amount of displacement in the direction normal to an image plane of the imager and a display plane of the displayer in synchronism with intervals of reading a signal representing one picture from the imager and intervals of sending the signal representing one picture to the displayer.

The displacement-providing operation by the displacer slices the interference fringe information in the thickness direction of the three-dimensional hologram information into a multiplicity of layers and two-dimensional hologram information for each layer is read by the imager successively. The two-dimensional hologram information for each layer is then transmitted by the transmission means successively and the two-dimensional hologram information for each layer is displayed in the displayer successively to thereby equivalently form the threedimensional hologram information so that there can be realized a holography television apparatus which operates at a speed close to real time in consideration of the visuality of the hologram image which constitutes an apparently three-dimensional image to the human eye.

BRIEF DESCRIPTION OF THE DRAWINGS

FIGS. 6A-E illustrate a method of fabricating the imaging element of FIG. 5;

FIGS. 8A–F illustrate a method of fabricating the display element of FIG. 7;

DESCRIPTION OF THE PREFERRED EMBODIMENTS

Figure 1:
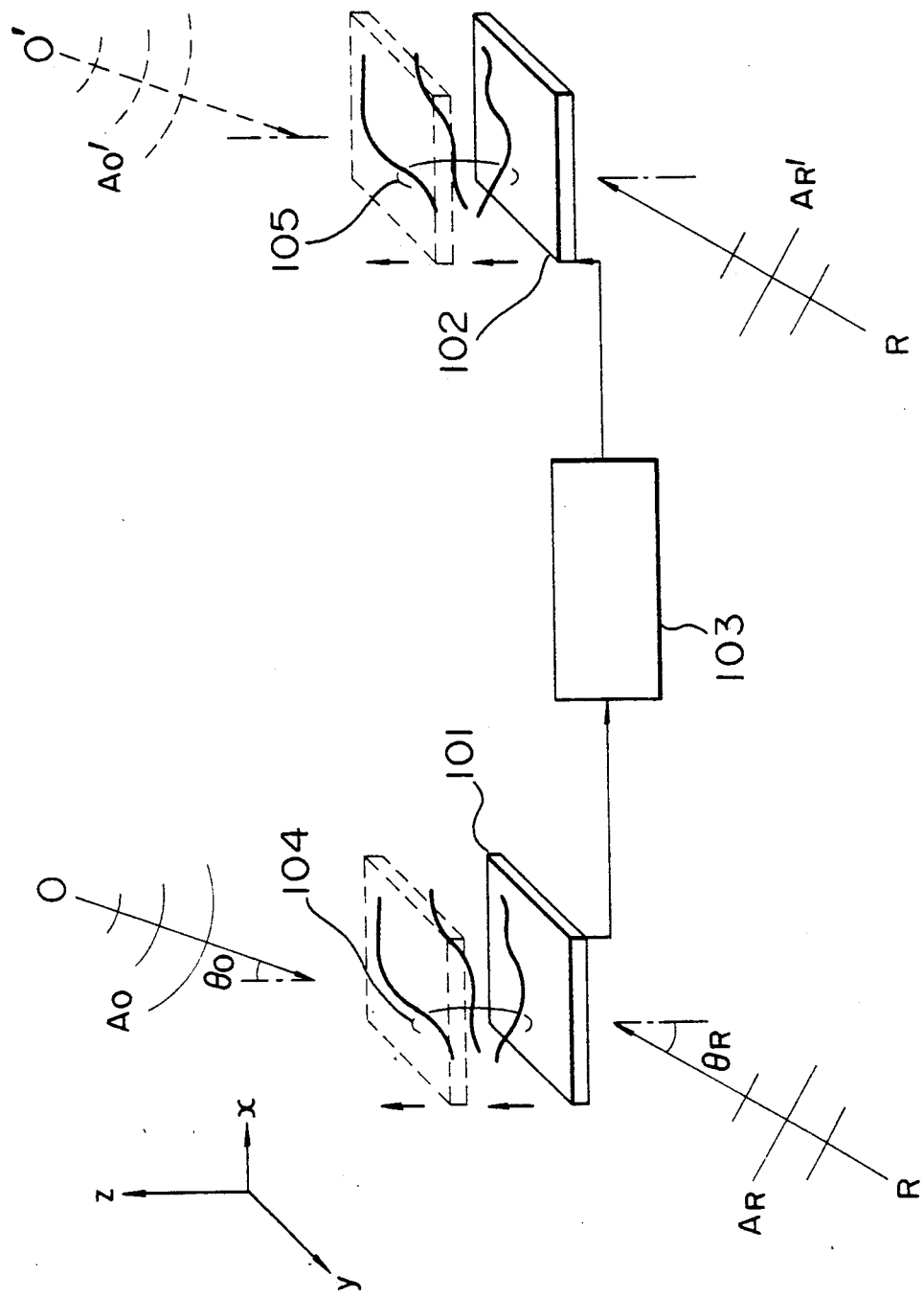
FIG. 1 schematically illustrates a basic configuration of a holography television apparatus according to the present invention.

A basic configuration of a holography television apparatus according to the present invention is illustrated in FIG. 1. The holography television apparatus comprises:

(a) an imager 101 including photoelectric conversion devices (or light receiving devices) arrayed in the two-dimensional directions (which are referred to as the X-direction and Y-direction or the horizontal direction and vertical direction);

(b) a displayer 102 including electrooptical conversion devices (or light emitting devices) arrayed in the two-dimensional directions; and (c) a transmission system 103 (including a transmission system in which signals in the form of electromagnetic waves are transmitted through the air) connecting a signal output terminal of the imager 101 to a signal input terminal of the displayer 102.

Further, the imager 101 and the displayer 102 can be displaced in the third direction (which is referred to as Z-direction or thickness direction) as shown by the arrows at a speed faster than the response speed of a human eye at regular or uniform intervals of distance. (Accordingly, a plurality of steps are required.)

More particularly, information of three-dimensional interference fringes 104 formed by reference light $A_R$ from a reference light source R and object light $A_O$ from an object O is detected and decomposed into multi-layers of two-dimensional hologram information by the imager 101 which is displaced at regular intervals in the thickness direction. The multi-layers of two-dimensional hologram information are transmitted through the transmission system 103 to the displayer 102 which is also displaced in the thickness direction at regular intervals and are displayed as multi-layers of two-dimensional hologram information by the displayer 102 so that the three-dimensional interference fringes 105 (which are equal to the interference fringes 104) are reproduced equivalently. When the same light source as the reference light source R is used as a reproduction light source R' for the interference fringes 105, reproduction light $A_R$ is identical with the reference light $A_R$ and a three-dimensional reproduced image O' is observed.

With the above basic configuration, the real three-dimensional reproduced image is obtained by application of holographic principles. That is, the intensity $I(x,y,z)$ of the interference fringes 104 produced by interfering the reference light $A_R(x,y,z)$ with the object light $A_O(x,y,z)$ in the three-dimensional space is expressed by $$I(x,y,x) = |A_R|^2 + |A_O|^2 + A_R \cdot A_O{}^* + A_R{}^* \cdot A_O \quad (1)$$

where $$A_R(x,y,z) = a_R(x,y,z) exp\{i\phi_R(x,y,x)\} \quad (2)$$

$$A_O(x,y,z) = a_O(x,y,z) exp\{\phi_O(x,y,z)\} \quad (3)$$

In this manner, if the expression in which an amplitude and a phase are separated is used (where exp(iwt) is omitted in accordance with custom), equation (1) is given by $$I(x,y,z) = a_R{}^2(x,y,z) + a_O{}^2(x,y,z) + 2a_R \cdot a_O \cos(\phi_R - \phi_O) \quad (4)$$

The first and second terms of equation (4) are equal to the intensity in the case where the reference light $A_R$ and the object light $A_O$ reached the image alone, respectively. However, $a_O$ is an amount which varies slowly by diffraction in the object and accordingly it is necessary to satisfy the following condition.

$$a_R > a_O \quad (5)$$

The third term of equation (4) is an alternating current component oscillating with an amplitude of $2a_R \cdot 2a_O$ in respect to a center of $(a_R{}^2 + a_O{}^2)$ representative of the average intensity in the direct current manner and represents the interference fringes having positional information $(\phi_R - \phi_O)$. These interference fringes are expressed by the following equations when angles of the reference light $A_R$ and the object light $A_O$ in respect to the imager are $\theta_R$ and $\theta_O$ and an angle of both of the reference light and the object light in respect to the X-Z plane is $\theta'$.

$$\phi_R(x,y,z) = R(x \cdot \cos\theta' \sin\theta_R + y \cdot \sin\theta' + z \cdot \cos\theta' \cos\theta_R) \quad (6)$$

$$\phi_O(x,y,z) = R(x \cdot \cos\theta' \sin\theta_O + y \cdot \sin\theta' + z \cdot \cos\theta' \cos\theta_O) \quad (7)$$

(where R is the number of waves in the three-dimensional hologram.)

A phase difference $\delta(x,y,z)$ between both waves is given by $$\delta(x,y,z) = R \cdot x \cdot \cos\theta'(\sin\theta_R - \sin\theta_O) + R \cdot z \cdot \cos\theta'(\cos\theta_R - \cos\theta_O) \quad (8\,1\,)$$

The location having the strongest intensity is:

$$\delta(x,y,z) = 2\,m\pi \quad [m \text{ is an integer}] \quad (9)$$

Accordingly, the position where the interference fringes occur is:

$$x = \{(\cos\theta_R - \cos\theta_O)/(\sin\theta_R - \sin\theta_O)\} \cdot z + (2m\theta/R)/\{(\sin\theta_R - \sin\theta_O) \cdot \cos\theta'\} \quad (10)$$

Therefore an angle $\alpha$ between the interference fringes and the z-axis is given by $$\begin{aligned}\alpha &= \tan^{-1}\{(\cos\theta_R - \cos\theta_O)/(\sin\theta_R - \sin\theta_O)\} \\ &= (\theta_R - \theta_O)/2\end{aligned} \quad (11)$$

In the three-dimensional hologram, since $\theta_O \simeq 0°$ and $\theta_R \simeq 180°$ are common, $\alpha \simeq 90°$ and the interference fringes parallel to the [X–Y] plane (corresponding to a light receiving plane and a display plane) are formed.

The properties are very advantageous conditions when the imager 101 and the displayer 102 are displaced. Specifically, when it is considered that the imager and the displayer are displaced in the Z direction, the resolution in the [X–Y] plane can be moderated and the resolution in the Z direction can be determined by a displacement distance by the displacer.

In magnetostrictive material, $\delta L/L = 10^{-6}$ and the resolution for the three-dimensional hologram can be 2.5~25 lines/μm. This is the same in the case of electrostrictive material.

In order to form the real three-dimensional reproduced image by using the interference fringes 105, when a light source equivalent to the reference light source R is used as the illumination light source R' for reproduction, the reproduction light $A_R'$ is equal to the reference light $A_R$.

At this time, light incident on the displayer is expressed using equation (1) as follows:

$$
\begin{aligned}
I(x,y,z) \cdot A_R &= |A_R|^2 \cdot A_R + |A_O|^2 \cdot A_R \\
&+ A_R \cdot A_O^* \cdot A_R + A_R^* \cdot A_O \cdot A_R \\
&= |A_R|^2 \cdot A_R + |A_O|^2 \cdot A_R \\
&+ |A_R|^2 \cdot A_O + |A_R|^2 \cdot A_O^*
\end{aligned} \quad (12)
$$

The first term of equation (12) corresponds to a light wave in the case where the reproduction light $A_R$ transmits through the hologram, and the second term corresponds to transmitted light which is slowly varied spatially in proportion to intensity $a_O{}^2$ of the object light and contains amplitude information of the object light but has no relationship to reproduction of the object light since there is no phase information. The third term of equation (12) has the appearance of the object light $A_O$ and accordingly forms a reproduced image of the object. This is a real three-dimensional reproduced image. The fourth term of equation (12) forms a reproduced image conjugate to the object light $A_O$.

This conjugate image is a distorted image affected by variation represented by $$A_R{}^2 = a_R{}^2 \exp(2i\phi_R) \quad (13)$$

Further, since the displayer 102 is considered to be a three-dimensional hologram, the displayer possesses the same wavelength selectivity as that of the Bragg diffraction and can utilizes incandescent light as the illumination light source R' for reproduction. In addition, if multiplexed interference fringes are formed by reference light constituted of laser beams having various colors and directed in different directions, a color three-dimensional image can be also formed. As the illumination light for reproduction, a laser beam having many corresponding colors may be used or incandescent light utilizing the wavelength selectivity of the threedimensional hologram may be used.

An actual embodiment of the present invention materializing the basic configuration shown in FIG. 1 is now described with reference to FIGS. 2 to 8.

Figure 2:
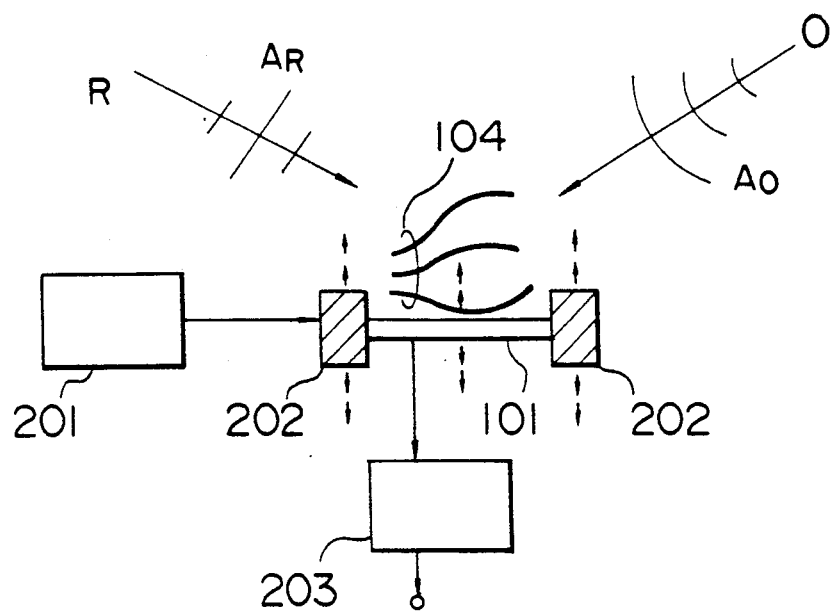
FIG. 2 schematically illustrates imaging means including an imager and a displacer constituting a part of a holography television apparatus according to the present invention.

FIG. 2 shows an embodiment of a detection device of three-dimensional hologram information which is incorporated into the displacer which displaces the imager 101 of FIG. 1 in the direction (for example, normal direction) different from the tangential direction of the image plane of the imager 101. The displacer comprises a signal generating circuit 201 which generates an electric field or a magnetic field signals varying a predetermined amount and an electrostrictive or a magnetostrictive material 202 which is displaced by a predetermined amount in accordance with variation of the signal from the signal generating circuit 201.

A signal of the imager 101 is converted into a desired image signal Sout by an image signal processing circuit 203.

Figure 3:
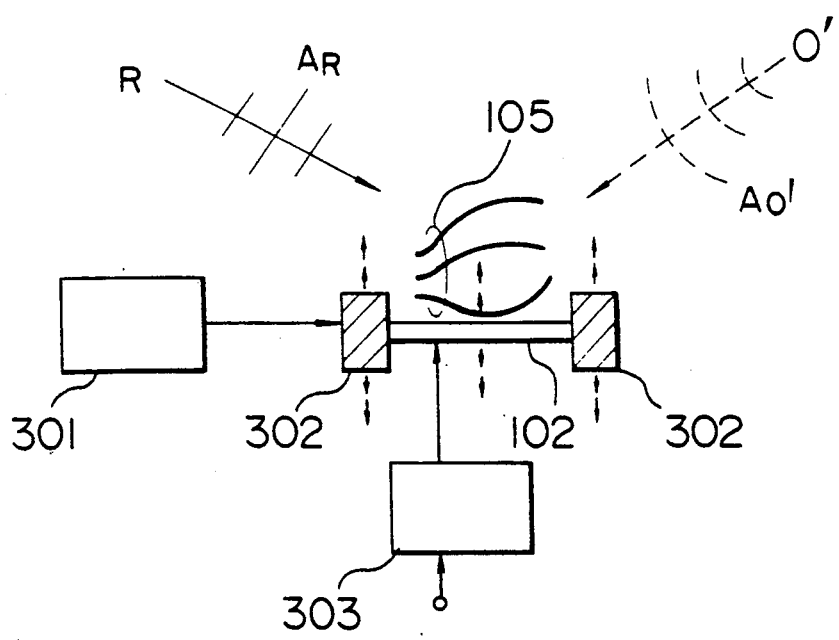
FIG. 3 schematically illustrates display means including a displayer and a displacer constituting a part of a holography television apparatus according to the present invention.

FIG. 3 shows an embodiment of a reproduction device of three-dimensional hologram information which is incorporated into the displacer which displaces the displayer 102 of FIG. 1 in the direction (for example, normal direction) different from the tangential direction of the display plane of the displayer 102. The displacer comprises a signal generating circuit 301 which generates an electric field or a magnetic field signal varying a predetermined amount and an electrostrictive or a magnetostrictive material 302 which is displaced by a predetermined amount in accordance with variation of the signal from the signal generating circuit 301. An image signal Sin inputted externally is converted into a signal suitable for driving the displayer by an image signal processing circuit 303.

Figure 4:
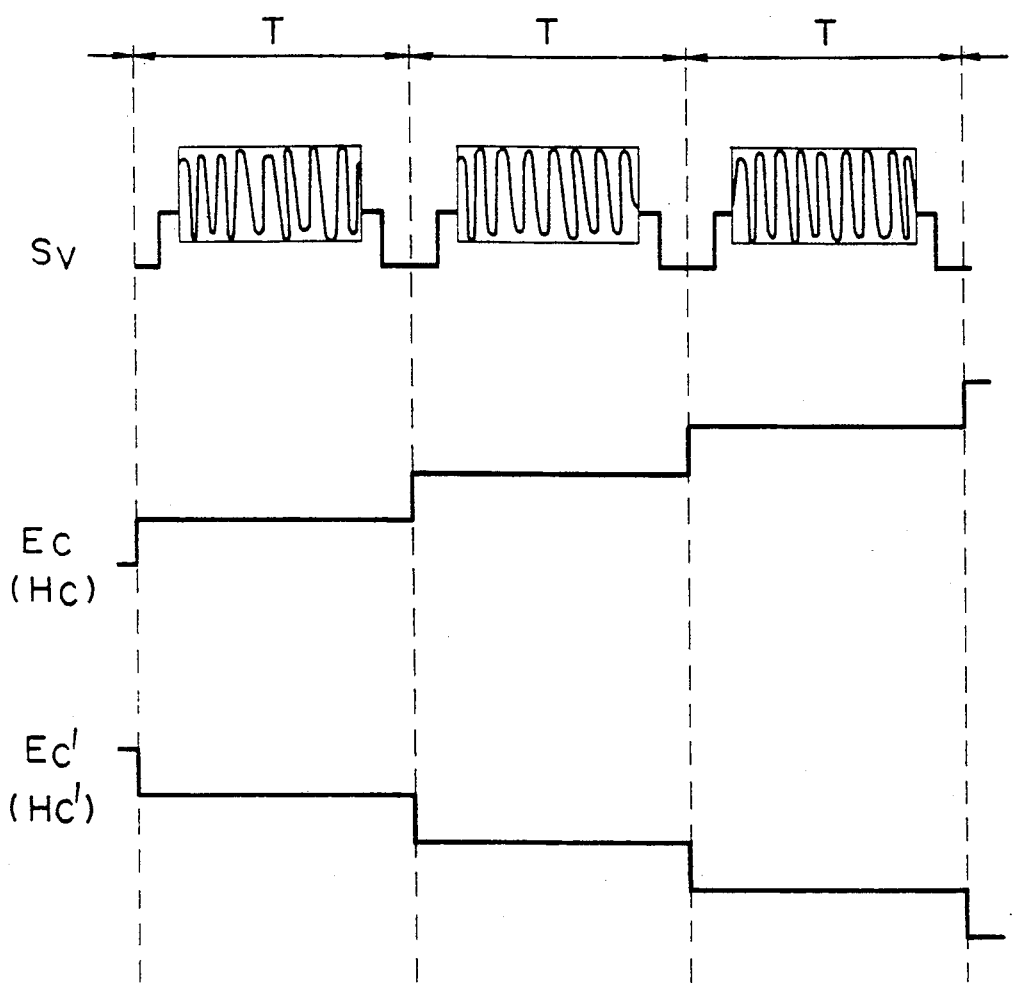
FIG. 4 is a waveform diagram showing drive waveforms in the displacer.

FIG. 4 shows a relationship of the output signal of the signal generating circuit 201 and image signal Sout in FIG. 2 and the output signal of the signal generating circuit 301 and the image signal Sin in FIG. 3. Vs of FIG. 4 corresponds to the image signals Sout and Sin, and in the NTSC system the vertical scanning period is commonly used as a repetition period T of the signal. However, when the horizontal scanning method uses parallel output or input, a time shorter than the vertical scanning period can be used as the repetition period T. Ec (or Hc) and Ec' (or Hc') of FIG. 4 show waveforms of the output signals of the signal generating circuits 201 and 301 and generate an electric field (or a magnetic field) increasing or decreasing a predetermined amount in the stepwise manner in response to the repetition period.

An embodiment and a fabricating method of a novel solid-state imager capable of utilizing the horizontal scanning period as the repetition period T are now described with reference to FIGS. 5 and 6, while the imager described hitherto may be an image pickup tube (or a camera using an image pickup tube) or a solid-state imaging element (or a camera using a solid-state imaging element).

Figure 5A:
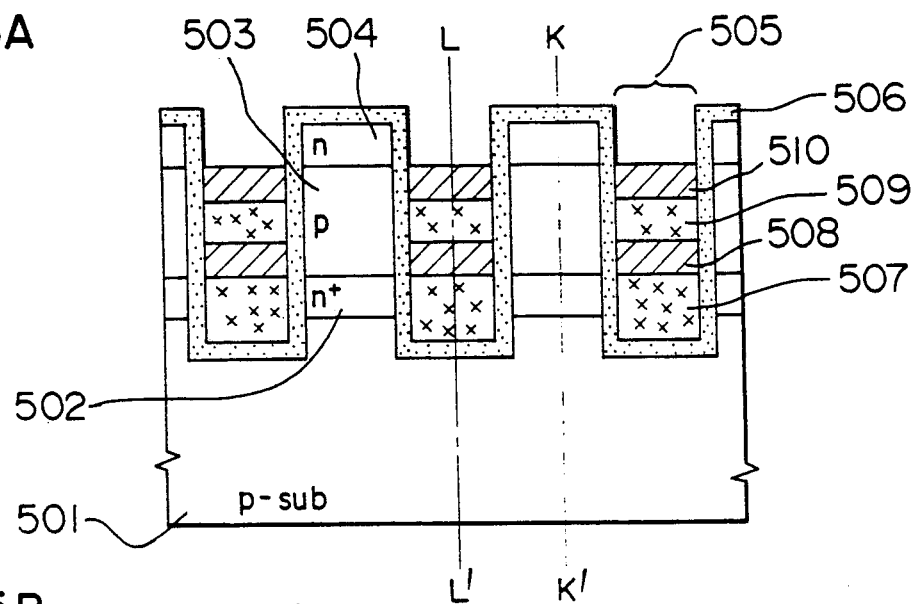
FIGS. 5A-E show an embodiment illustrating an imaging element which is a constituent element of the holography television apparatus according to the present invention.
Figure 5B:
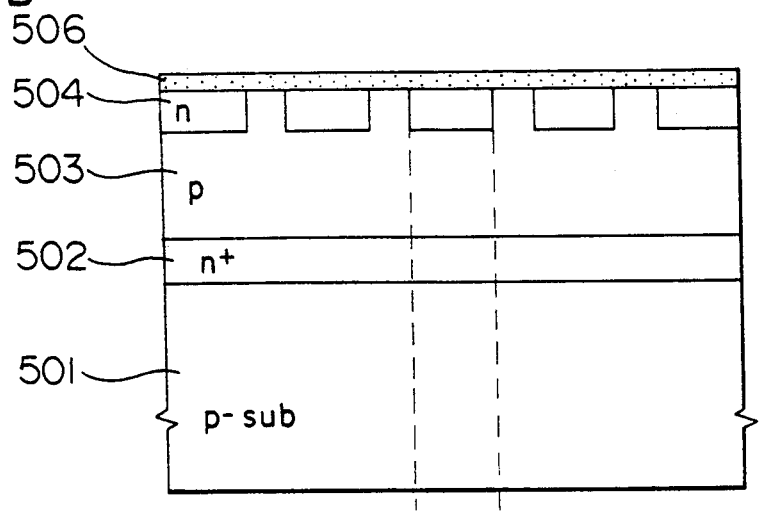
Figure 5C:
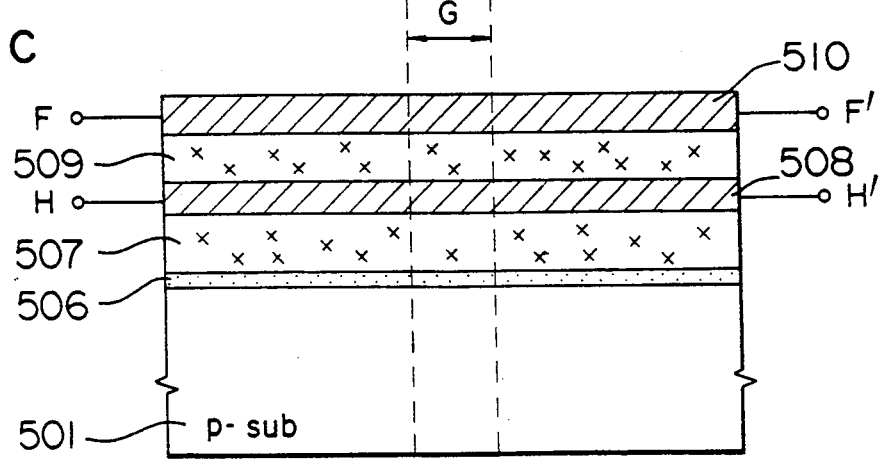
Figure 5D:
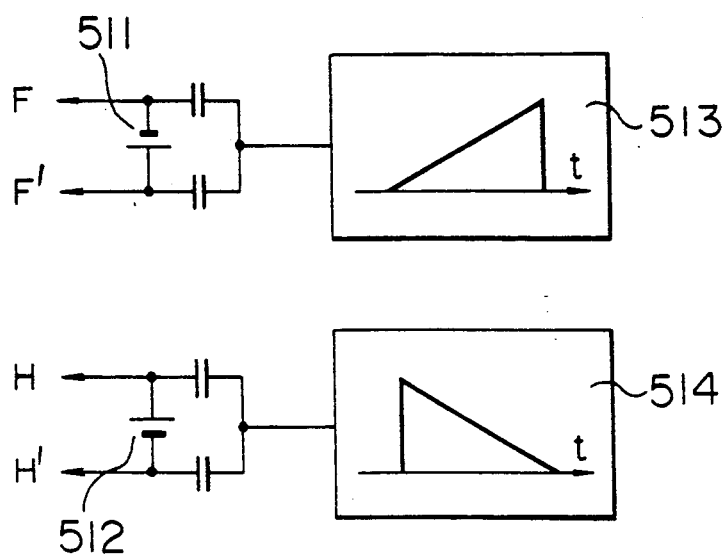
Figure 5E:
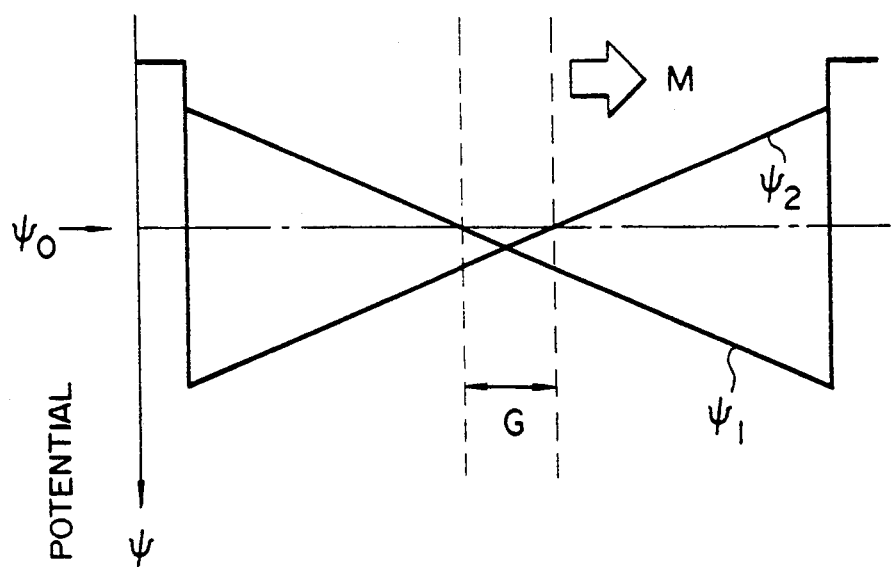

FIG. 5A shows an embodiment of a parallel readout solid-state imager (hereinafter referred to as a PR imager) in section perpendicular to the horizontal scanning direction. FIGS. 5B and 5C are sectional views parallel to the horizontal scanning direction and taken along lines K—K' and L—L' of FIG. 5A, respectively. FIG. 5D shows a circuit configuration connected to terminals F, F', H and H' of FIG. 5C. FIG. 5E shows potential distributions along the horizontal scanning direction of a channel region in the section K—K' of FIG. 5A.

The PR imager shown in FIGS. 5A, 5B and 5C comprises an n+ type region 502 formed on a p type substrate 501 to constitute a signal read-out line, a p type region 503 constituting a channel region, an n type region constituting a photoelectric conversion region, a concave trench groove 505 formed by etching the surface of the semiconductor in the horizontal scanning direction, an insulation film 506 formed on the surface of the semiconductor, a first resistive gate electrode 508 formed in the trench groove 505 through insulation films 506 and 507, and a second resistive gate electrode 510 formed in the trench groove 505 through an insulation film 509.

When the circuit of FIG. 5D (which comprises dc voltage sources 511 and 512 and signal generating circuits 513 and 514 which generate sawtooth signals having a repetition period equal to the horizontal scanning period as shown in FIG. 5D) is connected across the terminals H and H' provided in both ends of the first resistive gate electrode 508 and the terminals F and F' provided in both ends of the second resistive gate electrode 510 of FIG. 5C, potential distributions $\psi 1$ and $\psi 2$ are induced in the channel region 503 in the horizontal scanning direction and conduction between the n type region 504 and the n+type region 502 occurs at a region (section G in FIG. 5) in which $\psi 1$ and $\psi 2$ are larger than $\psi 0$. Furthermore, since the section G is moved in the direction of arrow M shown in FIG. 5E in the horizontal scanning period, horizontal scanning is performed simultaneously and in a manner.

When the embodiment is used as the imager, since one picture information can be produced in one horizontal scanning period, a time required to read out the three dimensional hologram information can be shortened. Accordingly, the holography television apparatus which operates at a speed nearer to real time can be achieved.

FIGS. 6A to 6F show a fabricating method of the PR imager of FIG. 5. An n+type semiconductor layer 502 is epitaxially grown on the p type substrate 501 and a p type semiconductor layer 503 is then epitaxially grown. A plurality of n type belt-like semiconductor regions 504 are formed in the direction perpendicular to the direction of forming the trench groove 505 which is to be formed thereafter. (The semiconductor regions 504 may be formed after formation of the trench groove.) [See FIG. 6A]

Figure 6A:
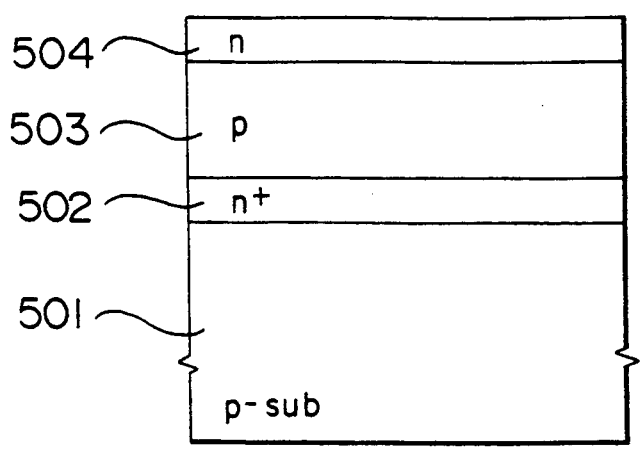
Figure 6B:
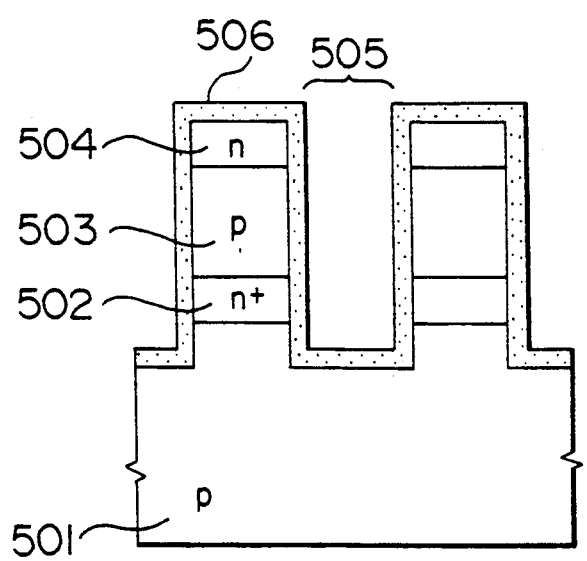
Figure 6C:
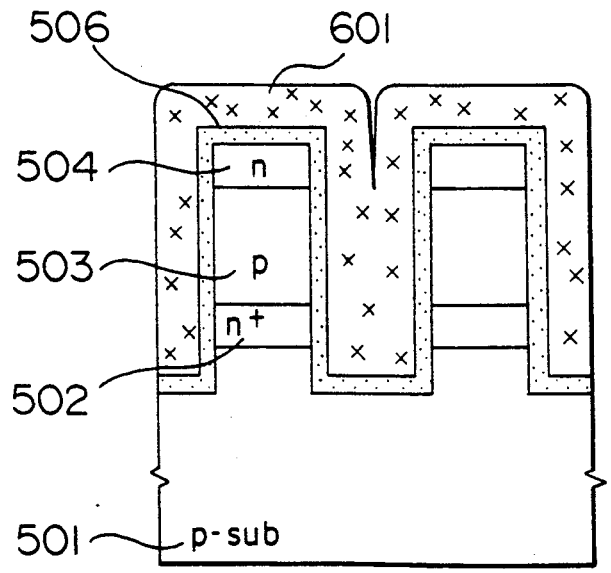

Then, the insulation film 506 is formed on the surface [See FIG. 6B]. An interlayer insulation film 601 is further deposited on the insulation film 506 [See FIG. 6C]. The interlayer insulation film 601 is removed from the surface thereof to the boundary between the p type region 503 and the n+type region 502 by the selective etching so that an insulation film 507 is formed in the left portion of the insulation film 601 [See to FIG. 6D]. Then, polysilicon 602 is deposited on the insulation film 507 by chemical vapor deposition (CVD) to form a resistive gate electrode. (The sheet resistivity having a value of about $15 \sim 200$ $\Omega/\square$ is used.) [See to FIG. 6E] The polysilicon 602 is removed from the surface to part of the p type region 503 near the n+type region 502 by the selective etching so that resistive gate electrode 508 is formed in the left portion of the polysilicon [See to FIG. 6F]. Thereafter, the PR imager shown in FIG. 5A is completed by repeating the steps of FIGS. 6C to 6F. The novel solid-state imager is configured and fabricated as described above.

An embodiment and a fabricating method of a novel solid-state displayer capable of utilizing the horizontal scanning period T are now described with reference to FIGS. 7 and 8, while the displayer which has been described above may be a cathode ray tube (abbreviated to CRT, or image display unit using a CRT) or a solid-state displayer (or a displayer using a solid-state displayer such as EL or LED elements).

Figure 7A:
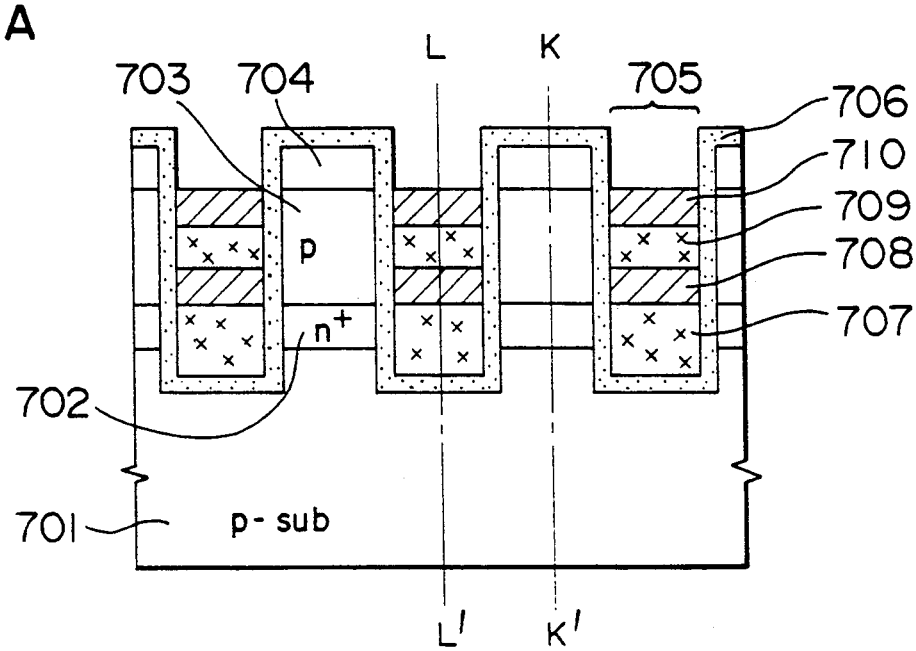
FIGS. 7A–E show an embodiment illustrating a display element which is a constituent element of the holography television apparatus according to the present invention.
Figure 7B:
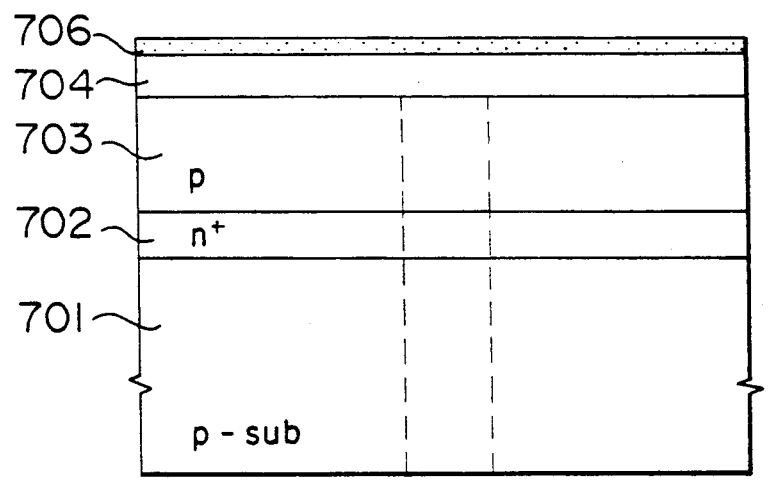
Figure 7C:
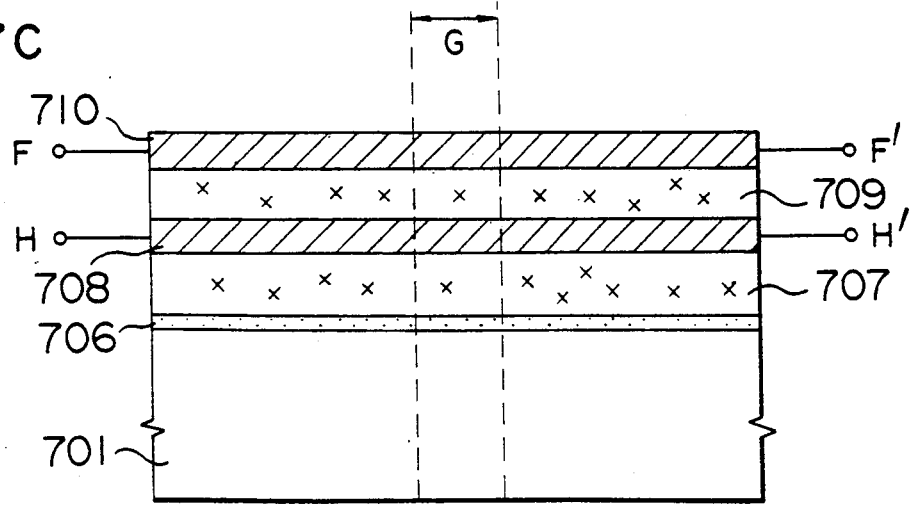
Figure 7D:
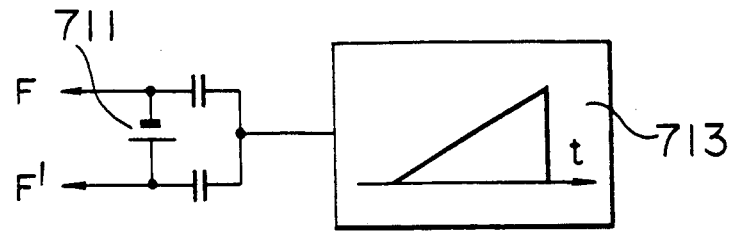
Figure 7D:
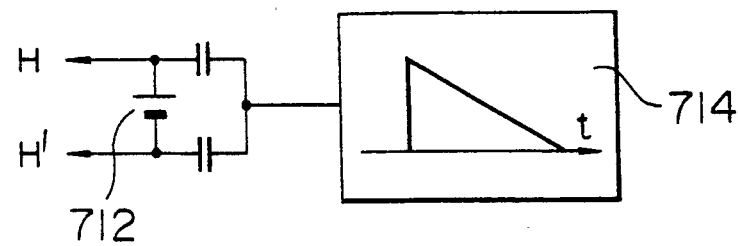
Figure 7E:
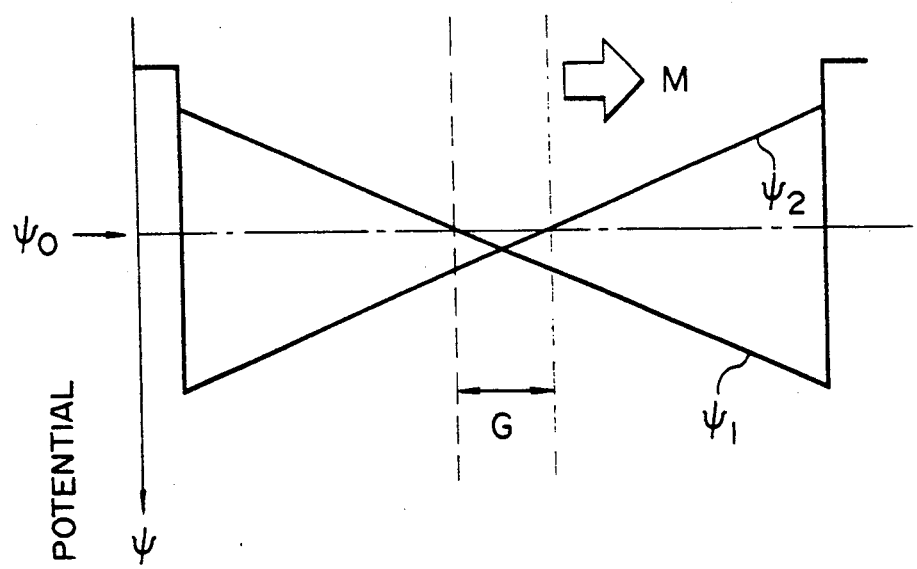

FIG. 7A shows an embodiment of a parallel readout solid-state displayer (hereinafter referred to as a PR displayer) in section perpendicular to the horizontal scanning direction. FIGS. 7B and 7C are sectional views parallel to the horizontal scanning direction and taken along lines K—K' and L—L' of FIG. 7A, respectively. FIG. 7D shows a circuit configuration connected to terminals F, F', H and H' of FIG. 7C. FIG. 7E shows potential distributions along the horizontal scanning direction of a channel region in the section K—K' of FIG. 7A.

The PR displayer shown in FIGS. 7A, 7B and 7C comprises an n+type region 702 formed on a p type substrate 701 to constitute a signal read-out line, a p type region 703 constituting a channel region, a fluorescent region 704 for luminescent display, a concave trench groove 705 formed by etching the surface of the semiconductor in the horizontal scanning direction, an insulation film 706 formed on the surface of the semiconductor, a first resistivity gate electrode 708 formed in the trench groove 705 through insulation films 706 and 707, and a second resistive gate electrode 710 formed in the trench groove 705 through an insulation film 709.

When the circuit of FIG. 7D (which comprises dc voltage sources 711 and 712 and signal generating circuits 713 and 714 which generate sawtooth signals having a repetition period equal to the horizontal scanning period as shown in FIG. 7E) is connected across the terminals H and H' provided in both ends of the first resistive gate electrode 708 and the terminals F and F' provided in both ends of the second resistive gate electrode 710 of FIG. 7C, potential distributions $\Psi 1$ and $\Psi 2$ are induced in the channel region 703 in the horizontal scanning direction and conduction between the fluorescent region 704 and the n+type region 702 occurs at a region (section G in FIG. 7) in which $\Psi 1$ and $\Psi 2$ are larger than $\Psi 0$. Furthermore, since the section G is moved in the direction of arrow M shown in FIG. 7E in the horizontal scanning period, horizontal scanning is performed simultaneously and in a manner.

When the embodiment is used as the displayer, since one picture information can be inputted in one horizontal scanning period, a time required to read out the three-dimensional hologram information can be shortened. Accordingly, the holography television apparatus which operates at a speed nearer to real time can be achieved. Further, since the luminescent region is formed of a fluorescent substance and utilizes non-scattering movement of charged carries, there can be realized an image display performance superior to a conventional CRT display.

FIGS. 8A to 8F show a fabricating method of the PR displayer of FIG. 7. An n+type semiconductor layer 702 is epitaxially grown on the p type substrate 701 and a p type semiconductor layer 703 is then epitaxially grown. At this time, the thickness of the semiconductor layer is substantially similar to the average free distance of the charged carrier (for example, electron). Then, the fluorescent region 704 is formed. (The fluorescent region 704 may be formed after the formation of the trench.) [See to FIG. 8A]

Figure 8A:
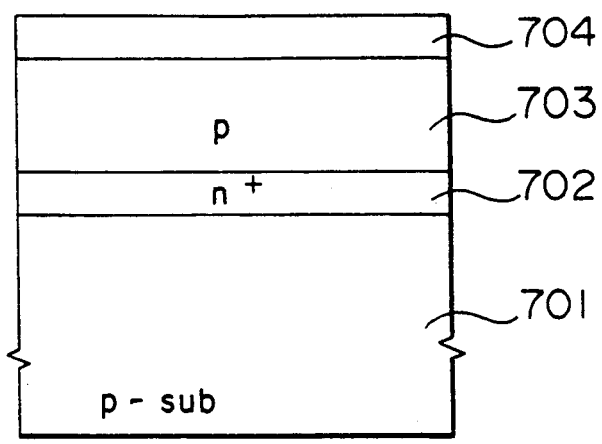
Figure 8B:
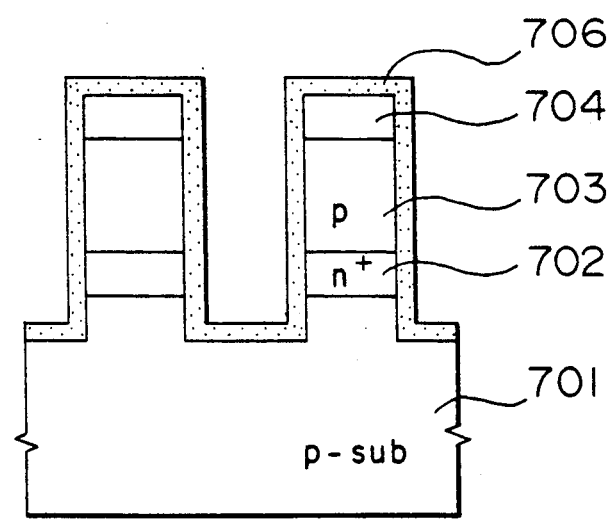
Figure 8C:
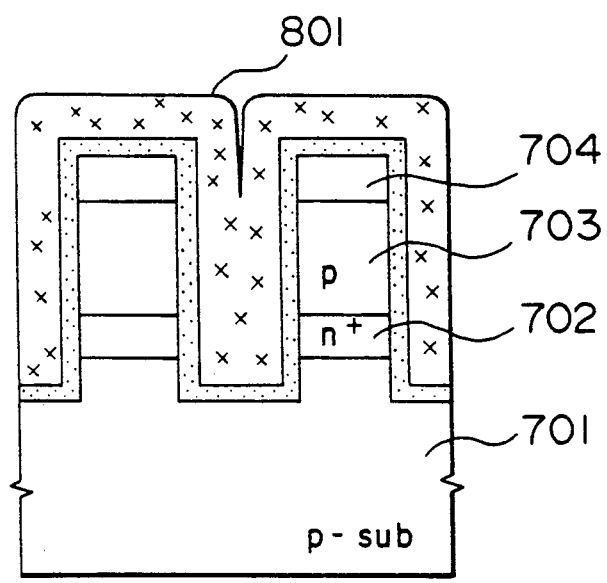
Figure 9:
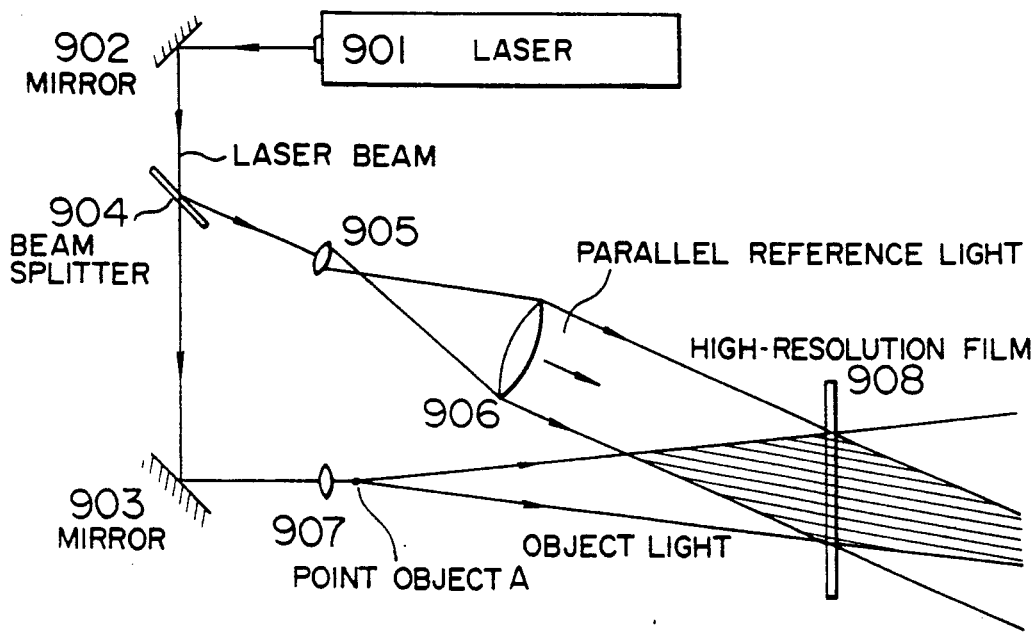
FIG. 9 schematically illustrates a principle of a conventional holography.
Figure 10A:
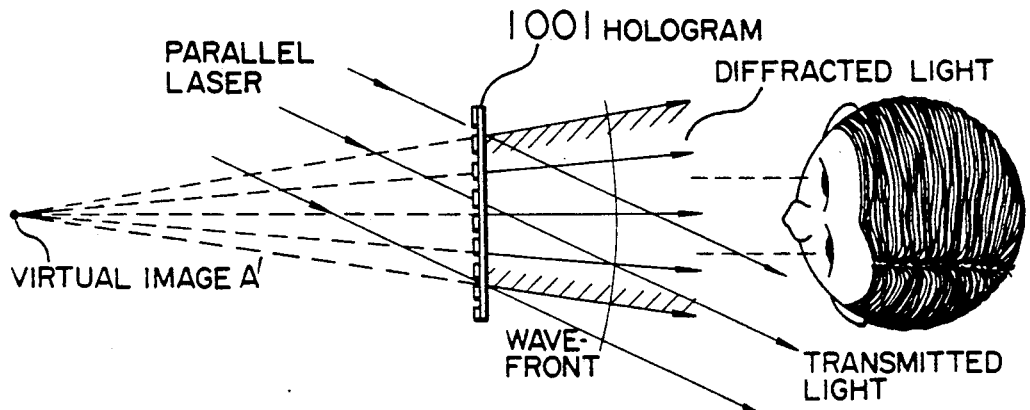
FIGS. 10A and B schematically illustrate a principle of reproduction of the hologram by the conventional holography.
Figure 10B:
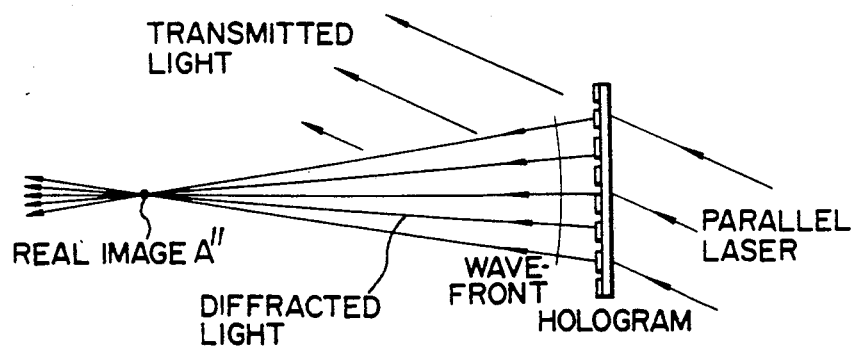

Then, the insulation film 706 is formed on the surface [See FIG. 8B]. An interlayer insulation film 801 is further deposited on the insulation film 806 [See FIG. 8C]. The interlayer insulation film 801 is removed from the surface thereof to the boundary between the p type region 703 and the n+type region 702 by the selective etching so that an insulation film 707 is formed in the left portion of the insulation film 801 [See FIG. 8D]. Then, polysilicon 802 is deposited on reinsulation film 707 by the chemical vapor deposition (CVD) to form a resistive gate electrode (The sheet resistivity having a value of about 15~200 Ω/□ is used) [See FIG. 8E]. The polysilicon 802 is removed from the surface to part of the p type region 703 near the n+type region 702 by the selective etching so that a resistive gate electrode 708 is formed in the left portion of the polysilicon [See FIG. 8F]. Thereafter, the PR displayer shown in FIG. 7A is completed by repeating the steps of FIGS. 8C to 8F. The novel solid-state imager is configured and fabricated as described above.

As described above, the holography television apparatus according to the present invention uses an imager and a displayer in combination with a displacer as the detection means and the reproduction means for the three-dimensional hologram information to reproduce a real three-dimensional image.

The present invention is not limited to the basic configuration as described above but can realize novel useful functions which have not been considered in the past only by using a part of the constituent elements. More particularly, when the three-dimensional hologram information detected by the imager coupled with the displacer is subjected to a signal conversion processing, the hologram information can be displayed on a conventional CRT display as the three-dimensional computer graphic image. Further, when the three-dimensional computer graphic image is subjected to signal conversion processing and is applied to the displayer coupled with the displacer, an equivalent three-dimensional hologram information can be reproduced to display the threedimensional image.

What is claimed is:

1. A three-dimensional image detection apparatus for detecting a three-dimensional holographic optical interference pattern, comprising:
    an image detector for detecting successively two-dimensional portions of the three-dimensional holographic optical interference pattern; and
    an actuator means for moving said image detector at predetermined regular intervals in a depth direction normal to said two-dimensional image portions to obtain information with respect to the three-dimensional optical interference pattern at uniformly spaced two-dimensional layers thereof corresponding to said intervals.

2. A detection apparatus according to claim 1, wherein said actuator means moves said image detector at said predetermined intervals in synchronism with intervals of time when one picture signal is read out from said image detector.

3. A three-dimensional image reproduction apparatus for reproducing three dimensional hologram information corresponding to a holographic optical interference pattern, comprising;
    a display device for successively displaying two-dimensional portions of the three-dimensional holographic optical interference pattern; and
    an actuator means for moving said display device at predetermined regular intervals in a depth direction normal to a display plane thereof to display information with respect to the three-dimensional optical interference pattern at uniformly spaced two-dimensional layers thereof corresponding to said intervals.

4. A reproducing apparatus according to claim 3, wherein said actuator means moves said display device at said predetermined intervals in synchronism with intervals of time when one picture signal is fed to said display device.

5. A three-dimensional image television apparatus for detecting and displaying threedimensional holographic information corresponding to a holographic optical interference pattern, comprising:
    an image detection device for detecting successively two-dimensional portions of the three-dimensional holographic optical interference pattern,
    an image reproduction device for successively reproducing twodimensional portions of the three-dimensional holographic optical interference pattern,
    transmission means connecting said image detection device to said image reproduction device, and
    an actuator means,
    said image detection device including an image detector, said actuator means for moving said image detector at predetermined regular intervals in a depth direction normal to said two-dimensional image portions to obtain information with respect to the three-dimensional optical interference pattern at uniformly spaced two-dimensional layers thereof corresponding to said intervals, said reproduction device including a display device for displaying said two-dimensional portions of the three-dimensional holographic optical interference pattern, said actuator means for moving said display device at predetermined regular intervals in a depth direction normal to a display plane thereof to display information with respect to the three-dimensional optical interference pattern at uniformly spaced two-dimensional layers thereof corresponding to said intervals.

6. A solid-state image sensor comprising a semiconductor substrate having a plurality of concave trench grooves formed lengthwise in one direction on a surface thereof, a light receiving photoelectric conversion portion formed on the surface of said semiconductor substrate disposed between said trench grooves, and a plurality of resistive gate electrodes formed continuously in and along said trench grooves.

7. A solid-state image display device comprising a semiconductor substrate having a plurality of concave trench grooves formed lengthwise in one direction on a surface thereof, a light emitting electroopitcal conversion portion formed on the surface of said trench grooves, and a plurality of resistive gate electrodes formed continuously in and along said trench grooves.

8. An actuating apparatus for moving one of an image sensor and an image display device at predetermined regular intervals in a direction normal to one of a sensed image plane and a display plane, comprising a circuit for generating one of an electric field and a magnetic field varying a predetermined amount and one of an electrostrictive and a magnetostrictive material to which a signal of said circuit is applied.

* * * * *